United States Patent
Sawamura

(10) Patent No.: US 9,667,387 B2
(45) Date of Patent: May 30, 2017

(54) IC CARD, PORTABLE ELECTRONIC DEVICE, AND IC CARD PROCESSING DEVICE

(71) Applicant: Kabushiki Kaisha Toshiba, Tokyo (JP)

(72) Inventor: Satoshi Sawamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 14/833,944

(22) Filed: Aug. 24, 2015

(65) Prior Publication Data
US 2016/0085620 A1 Mar. 24, 2016

(30) Foreign Application Priority Data

Aug. 25, 2014 (JP) .................................. 2014-170695

(51) Int. Cl.
*H04L 1/18* (2006.01)
*G06F 13/38* (2006.01)
(Continued)

(52) U.S. Cl.
CPC ........ *H04L 1/1819* (2013.01); *G06F 11/1004* (2013.01); *G06F 13/382* (2013.01);
(Continued)

(58) Field of Classification Search
CPC ............................. H04L 1/1819; H04L 1/1896
See application file for complete search history.

(56) References Cited

U.S. PATENT DOCUMENTS

| 5,144,667 A * | 9/1992 | Pogue, Jr. ............... B60R 25/24 |
| | | 340/5.61 |
| 5,570,389 A * | 10/1996 | Rossi ...................... H04L 1/188 |
| | | 375/220 |

(Continued)

FOREIGN PATENT DOCUMENTS

| JP | 2013146030 A | 7/2013 |
| JP | 2014-002471 A | 1/2014 |
| KR | 20110010543 A | 2/2011 |

OTHER PUBLICATIONS

Official Action issued in related Singapore application No. 10201506676Y, mailed on Feb. 18, 2016 (8 pages).
(Continued)

*Primary Examiner* — Joseph D Torres
(74) *Attorney, Agent, or Firm* — Baker Botts L.L.P.

(57) ABSTRACT

According to one embodiment, an IC card includes a first transmission processing section, creation section, second transmission processing section, third reception processing section, and third transmission processing section. The first transmission processing section transmits a first response including the request data. The creation section creates a detailed redundancy check code including a redundancy check code of each of divided blocks. The second transmission processing section transmits the detailed redundancy check code. The third reception processing section receives a third command to request an erroneous divided block. The third transmission processing section transmits a third response including a divided block corresponding to the erroneous divided block.

10 Claims, 7 Drawing Sheets

(51) Int. Cl.
*G06F 11/10* (2006.01)
*H03M 13/09* (2006.01)
*G06K 19/073* (2006.01)

(52) U.S. Cl.
CPC .......... *G06K 19/073* (2013.01); *H03M 13/09* (2013.01); *H04L 1/1896* (2013.01)

(56) References Cited

U.S. PATENT DOCUMENTS

| | | | | |
|---|---|---|---|---|
| 6,014,765 | A * | 1/2000 | Maeda | H04L 1/165 714/748 |
| 6,704,898 | B1 * | 3/2004 | Furuskar | H04L 1/1819 714/749 |
| 6,728,918 | B1 * | 4/2004 | Ikeda | H04B 7/2643 714/748 |
| 7,349,713 | B2 * | 3/2008 | Miyoshi | H04L 1/08 370/333 |
| 2001/0034209 | A1 * | 10/2001 | Tong | H04L 1/0002 455/69 |
| 2002/0046380 | A1 * | 4/2002 | Tomaru | H03M 13/35 714/751 |
| 2002/0049068 | A1 * | 4/2002 | Koo | H04L 1/1671 455/522 |
| 2002/0199147 | A1 * | 12/2002 | Kim | H04L 1/0066 714/748 |
| 2003/0097629 | A1 * | 5/2003 | Moon | H04L 1/0003 714/751 |
| 2003/0177436 | A1 * | 9/2003 | Gruhn | H04L 1/1671 714/776 |
| 2003/0202500 | A1 * | 10/2003 | Ha | H04L 1/0003 370/342 |
| 2004/0015767 | A1 | 1/2004 | Futagi et al. | |
| 2004/0181740 | A1 * | 9/2004 | Tomaru | H04L 1/1812 714/776 |
| 2005/0050424 | A1 * | 3/2005 | Matsuura | H04L 1/0061 714/748 |
| 2005/0122898 | A1 * | 6/2005 | Jang | H04L 1/1819 370/218 |
| 2005/0149841 | A1 * | 7/2005 | Kyung | H03M 13/2957 714/800 |
| 2006/0182199 | A1 * | 8/2006 | Hong | H04L 1/0003 375/299 |
| 2006/0234628 | A1 * | 10/2006 | Horiguchi | H04L 1/0006 455/39 |
| 2007/0089025 | A1 * | 4/2007 | Hong | H03M 13/1102 714/758 |
| 2007/0113147 | A1 * | 5/2007 | Hong | H03M 13/1102 714/758 |
| 2008/0043703 | A1 * | 2/2008 | Choi | H04L 1/0009 370/342 |
| 2008/0082890 | A1 * | 4/2008 | Choi | H04L 1/1867 714/748 |
| 2008/0256410 | A1 * | 10/2008 | Park | H04L 1/0668 714/748 |
| 2009/0055701 | A1 * | 2/2009 | Hoshino | H04L 1/0009 714/748 |
| 2009/0089644 | A1 | 4/2009 | Mead | |
| 2009/0249133 | A1 * | 10/2009 | Pons | H04L 1/0045 714/701 |
| 2010/0091902 | A1 * | 4/2010 | Park | H04L 1/1893 375/295 |
| 2010/0131818 | A1 * | 5/2010 | Zhou | H04L 1/0057 714/751 |
| 2010/0146355 | A1 * | 6/2010 | Jiang | H04L 1/1671 714/749 |
| 2010/0272111 | A1 * | 10/2010 | Kini | H04L 45/00 370/395.53 |
| 2011/0016373 | A1 | 1/2011 | Teruyama et al. | |
| 2011/0099446 | A1 * | 4/2011 | Murakami | H04L 1/0041 714/748 |
| 2011/0274277 | A1 * | 11/2011 | Hennebert | H04L 1/1671 380/273 |
| 2012/0067947 | A1 | 3/2012 | Fukuda | |
| 2012/0112889 | A1 | 5/2012 | Mo et al. | |
| 2013/0308540 | A1 * | 11/2013 | Abe | H04L 1/0067 370/328 |
| 2014/0084063 | A1 | 3/2014 | Uchida | |

OTHER PUBLICATIONS

Extended European Search Report issued in related European Patent appln. No. 15182170.9, mailed on Nov. 11, 2015 (7 pages).

Office Action issued in related Korean Patent Application No. 10-2015-0112919 mailed May 20, 2016, 9 pages (with translation.).

* cited by examiner

| Prologue field | | | Information field | Epilogue field |
|---|---|---|---|---|
| PCB | [CID] | [NAD] | [INF] | EDC |
| 1 byte | 1 byte | 1 byte | | 2 bytes |
| | | | Length    Block number | |
| | | | 00000011  00000001 00000010 00000111 | |

F I G. 5

| b8 | b7 | b6 | b5 | b4 | b3 | b2 | b1 |
|---|---|---|---|---|---|---|---|
| 0 | 1 | 1 | 1 | | | 1 | |

F I G. 6

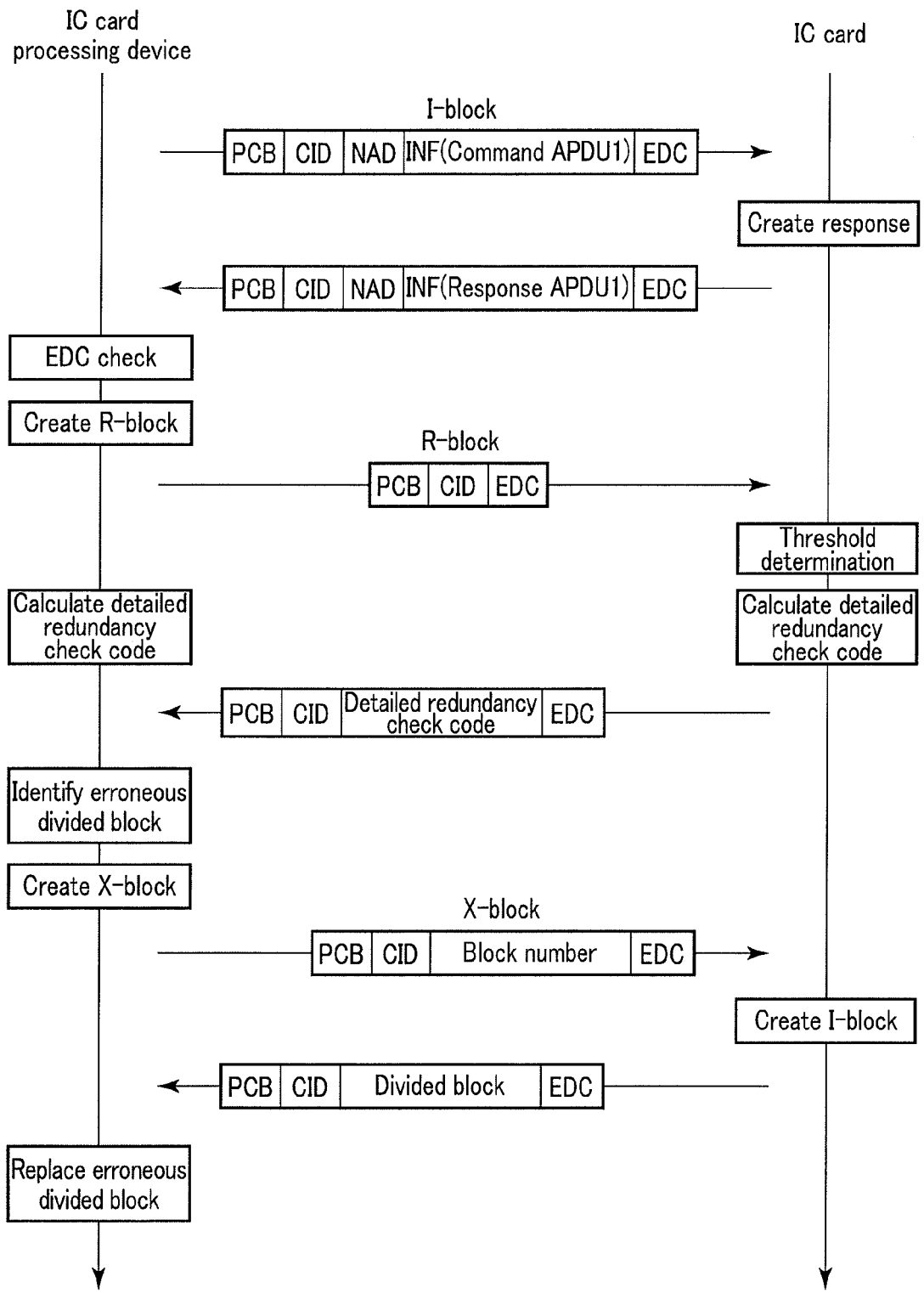
F I G. 7

IC CARD, PORTABLE ELECTRONIC DEVICE, AND IC CARD PROCESSING DEVICE

CROSS-REFERENCE TO RELATED APPLICATIONS

This application is based upon and claims the benefit of priority from Japanese Patent Application No. 2014-170695, filed Aug. 25, 2014, the entire contents of which are incorporated herein by reference.

FIELD

Embodiments described herein relate generally to an IC card, portable electronic device, and IC card processing device.

BACKGROUND

Some of portable electronic devices such as an IC card and the like use a redundancy check code in order to detect a communication error in data communication with an external device. Heretofore, a portable electronic device imparts a redundancy check code to the whole of data which can be transmitted by communication of one time, and repeats retransmission processing until the external device of the transmission destination can confirm the correctness of the data. However, there is a problem that the portable electronic device takes a lot of time to carry out the retransmission processing, and there is a possibility of the communication time and the whole processing time becoming too long.

OBJECT OF THE INVENTION

An object of the invention is to provide, in order to solve the above-mentioned problem, an IC card, portable electronic device, and IC card processing device which can efficiently transmit/receive data even when a communication error occurs.

BRIEF DESCRIPTION OF THE DRAWINGS

FIG. 5 is a view showing a configuration example of a format of an X-block transmitted/received by the IC card and IC card processing device according to the embodiment.

FIG. 6 is a view showing a format example of a PCB of an X-block transmitted/received by the IC card and IC card processing device according to the embodiment.

FIG. 7 is a view showing an example of a sequence of communication between the IC card and IC card processing device according to the embodiment including a communication error.

DETAILED DESCRIPTION

In general, according to one embodiment, an IC card includes a communication section, first reception processing section, first transmission processing section, second reception processing section, creation section, second transmission processing section, third reception processing section, and third transmission processing section. The first reception processing section receives a first command to request data. The first transmission processing section transmits a first response including the data. The second reception processing section receives a second command which is a retransmission request of the data. The creation section creates, when the second reception processing section has received the second command, a detailed redundancy check code including a redundancy check code of each of divided blocks formed by dividing the data into blocks each of which has a predetermined length. The second transmission processing section transmits a second response including the detailed redundancy check code created by the creation section. The third reception processing section receives a third command to request an erroneous divided block of the data. The third transmission processing section transmits a third response including a divided block corresponding to the erroneous divided block.

Hereinafter, an embodiment will be described with reference to the drawings.

Figure 1:
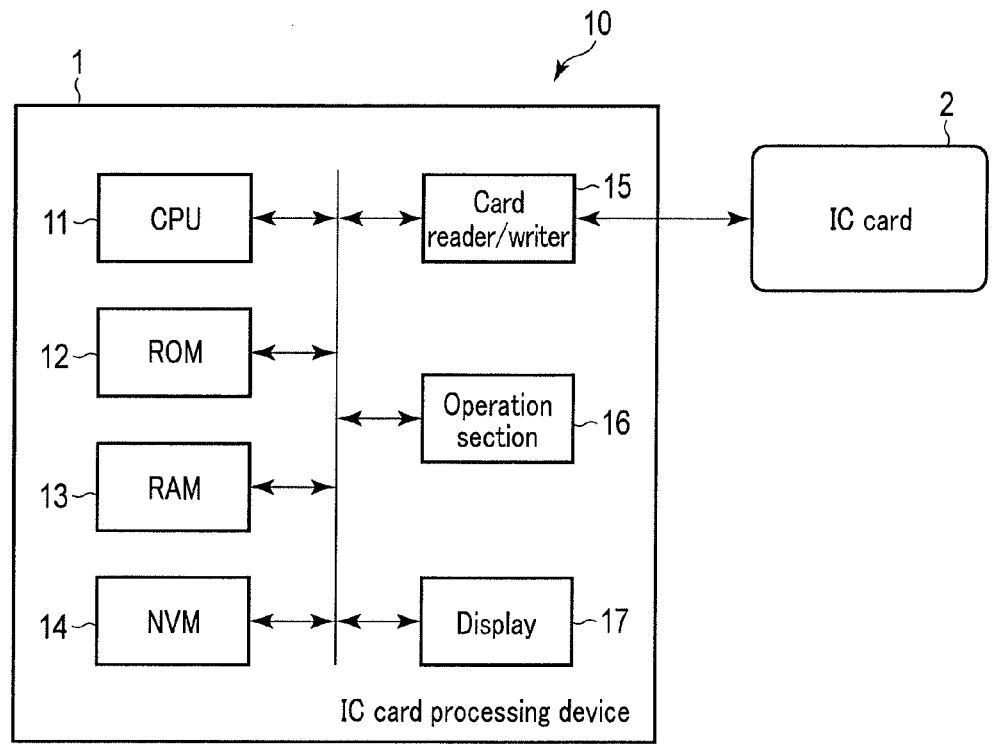
FIG. 1 is a view showing a configuration example of an IC card processing system including an IC card and IC card processing device according to an embodiment.

FIG. 1 is a block diagram for explaining a configuration example of an IC card processing system 10 including an IC card 2 serving as a portable electronic device according to the embodiment and IC card processing device 1 serving as an external device configured to carry out communication with the IC card 2.

In the configuration example shown in FIG. 1, the IC card processing device 1 (external device) includes, as a basic configuration, a CPU 11, ROM 12, RAM 13, NVM 14, card reader/writer 15, operation section 16, display 17, and the like. These members are connected to each other through a data bus. It should be noted that the IC card processing device 1 may include, in addition to the configuration shown in FIG. 1, a configuration according to a requirement or may exclude a specific configuration.

The CPU 11 (processor) has a function of serving as a control section (controller) configured to control operations of the whole of the IC card processing device 1. The CPU 11 may include an internal cache, various interfaces, and the like. The CPU 11 realizes various processing operations by executing programs previously stored in an internal memory, in the ROM 12 or in the NVM 14.

The CPU 11 has a function of transmitting a command to the IC card 2 by means of the card reader/writer 15, function of carrying out various processing operations on the basis of data such as a response and the like received from the IC card 2, and the like. For example, the CPU 11 transmits a write command including data input to the operation section 16, and the like or predetermined data, and the like to the IC card 2 through the card reader/writer 15, whereby the CPU 11 carries out control to request the IC card 2 to carry out write processing of the data.

It should be noted that part of the various types of functions realized by the CPU 11 by executing programs may be realized by hardware circuits. In this case, the CPU 11 controls the functions executed by the hardware circuits.

The ROM 12 is a nonvolatile memory in which a control program, control data, and the like are stored in advance. The control program and control data to be stored in the ROM 12 are previously incorporated therein according to the specification of the IC card processing device 1. The ROM 12 stores therein, for example, a program (for example, BIOS) or the like configured to control a circuit board of the IC card processing device 1.

The RAM 13 is a volatile memory. The RAM 13 temporarily stores therein data or the like being processed by the CPU 11. The RAM 13 sores therein various application programs on the basis of an instruction from the CPU 11. Further, the RAM 13 may store therein data necessary for execution of the application programs, execution results of the application programs, and the like.

The NVM 14 is a nonvolatile memory to which data can be written, and in which data can be rewritten. The NVM 14 is constituted of, for example, a hard disk, SSD, EEPROM, flash memory or the like. The NVM 14 stores therein control programs, applications, and various data items according to the application purpose of the IC card processing device 1.

The card reader/writer 15 (interface) is an interface device configured to carry out communication with the IC card 2. The card reader/writer 15 is constituted of an interface corresponding to the communication system of the IC card 2. For example, when the IC card 2 is a contact-type IC card, the card reader/writer 15 is constituted of a contacting section or the like configured to physically and electrically connect to a contact section of the IC card 2.

Further, when the IC card 2 is a non-contact IC card, the card reader/writer 15 is constituted of an antenna, and communication control section or the like which are configured to carry out wireless communication with the IC card 2. In the card reader/writer 15, power supply and clock supply to the IC card 2, reset control of the IC card 2, and data transmission/reception to/from the IC card 2 are carried out.

By such functions, the card reader/writer 15 carries out power supply to the IC card 2, activation (startup) of the IC card 2, clock supply, reset control, transmission of various commands, reception of responses to the transmitted commands, and the like on the basis of the control carried out by the CPU 11.

To the operation section 16, various operation instructions are input by the operator of the IC card processing device 1. The operation section 16 transmits data of the operation instruction input thereto by the operator to the CPU 11. The operation section 16 is, for example, a keyboard, numeric keypad, touch panel or the like.

The display 17 is a display device configured to display various information items by the control of the CPU 11. The display 17 is, for example, a liquid crystal monitor or the like. It should be noted that the display 17 may be formed integral with the operation section 16.

Next, the IC card 2 will be described below.

The IC card 2 is configured to be activated (be brought into a state where the IC card 2 can be operated) by being supplied with electric power or the like from a higher-level device such as the IC card processing device 1 or the like. For example, when the IC card 2 is connected to the IC card processing device 1 by contact-type communication, i.e., when the IC card 2 is constituted of a contact-type IC card, the IC card 2 is activated by being supplied with operation power and an operation clock from the IC card processing device 1 through the contact section serving as a communication interface.

Further, when the IC card 2 is connected to the IC card processing device 1 by a non-contact communication system, i.e., when the IC card 2 is constituted of a non-contact IC card, the IC card 2 is configured to receive an electric wave from the IC card processing device 1 through an antenna serving as a communication interface, and modulation/demodulation circuit or the like, and generate operation power and an operation clock from the received electric wave by means of a power supply section (not shown) to thereby be activated.

Next, a configuration example of the IC card 2 will be described below.

Figure 2:
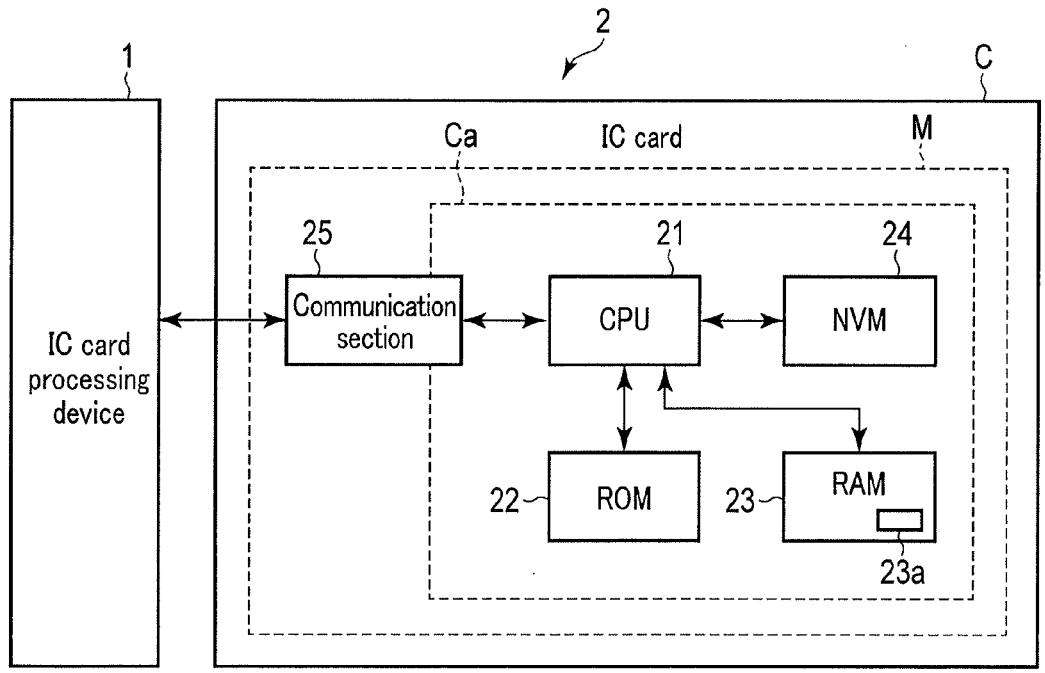
FIG. 2 is a block diagram showing a configuration example of an IC card according to the embodiment.

FIG. 2 is a block diagram schematically showing the configuration example of the IC card 2 according to the embodiment.

The IC card 2 includes a card-like main body C formed of plastic or the like. In the IC card 2, a module M is incorporated in the main body C. The module M is formed in an integrated manner in a state where one or a plurality of IC chips Ca and external interface (communication interface) serving as a communication section are connected to each other, and is embedded in the main body C of the IC card 2.

In the configuration example shown in FIG. 2, the IC card 2 includes a CPU 21, ROM 22, RAM 23, NVM 24, communication section 25, and the like. These members are connected to each other through a data bus. Further, the CPU 21, ROM 22, RAM 23, and NVM 24 are constituted of one or a plurality of IC chips Ca, and constitute the module M in a state where they are connected to the communication section 25.

The CPU 21 (processor) functions as a control section (controller) configured to manage control of the whole of the IC card 2. The CPU 21 carries out various processing operations on the basis of control programs and control data stored in the ROM 22 or in the NVM 24. For example, the CPU 21 executes programs stored in the ROM 22 to thereby carry out various processing operations corresponding to the operation control of the IC card 2 or the operation form of the IC card 2.

It should be noted that part of the various types of functions may be realized by hardware circuits. In this case, the CPU 21 controls the functions executed by the hardware circuits.

The ROM 22 is a nonvolatile memory previously storing therein a control program, control data, and the like. The ROM 22 is incorporated into the IC card 2 at the production stage in a state where the control program, control data, and the like are stored therein. That is, the control program and control data to be stored in the ROM 22 are previously incorporated in the IC card 2 according to the specification of the IC card 2.

The RAM 23 is a volatile memory. The RAM 23 temporarily stores therein data or the like being processed by the CPU 21. For example, the RAM 23 functions as a calculation buffer, reception buffer, and transmission buffer. As the calculation buffer, the RAM 23 temporarily stores therein results or the like of various calculation processing operations to be executed by the CPU 21. As the reception buffer, the RAM 23 retains therein command data or the like received from the IC card processing device 1 through the communication section 25. As the transmission buffer, the RAM 23 retains therein a message (response data) or the like to be transmitted to the IC card processing device 1 through the communication section 25. Further, the RAM 23 stores therein a flag indicating an operating state.

Further, the RAM 23 (memory) includes a storage area 23a or the like storing therein a retransmission request counter. The retransmission request counter counts the number of times the command to retransmit predetermined data is received from the IC card processing device 1.

The NVM 24 is constituted of a nonvolatile memory to which data can be written, and in which data can be rewritten such as an EEPROM, flash ROM or the like. The NVM 24 stores therein a control program, application, and various data items according to the application purpose of the IC card 2. For example, in the NVM 24, a program file, data file, and the like are created. To each of the created files, a control program, various data items, and the like are written.

The communication section 25 is an interface configured to carry out communication with the card reader/writer 15 of the IC card processing device 1. In the IC card 2 serving as a non-contact IC card, the communication section 25 is constituted of a communication control section such as a modulation/demodulation circuit or the like and antenna which are configured to carry out wireless communication with the card reader/writer 15 of the IC card processing device 1.

The communication section 25 is an interface configured to carry out communication with the card reader/writer 15 of the IC card processing device 1. When the IC card 2 is realized as a contact-type IC card, the communication section 25 is constituted of a communication control section and contact section configured to come into physical and electrical contact with the card reader/writer 15 of the IC card processing device 1, and carry out signal transmission/reception. Further, when the IC card 2 is realized as a non-contact IC card, the communication section 25 is constituted of a communication control section such as a modulation/demodulation circuit or the like, and antenna which are configured to carry out wireless communication with the card reader/writer 15 of the IC card processing device 1.

Here, it is assumed that the IC card processing device 1 and the IC card 2 carry out data communication in a non-contact manner.

Figure 3:
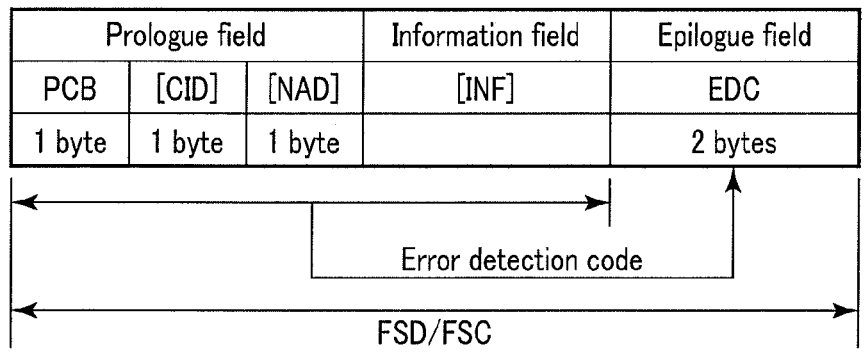
FIG. 3 is a view showing a configuration example of a format of a data block transmitted/received by the IC card and IC card processing device according to the embodiment.

FIG. 3 is a view showing a configuration example of a format of a data block to be transmitted/received by the IC card 2 and IC card processing device 1.

The configuration example shown in FIG. 3 shows a configuration example of a data block transmitted/received by a data transmission system stipulated in ISO/IEC 14443-4. In the data transmission system stipulated in ISO/IEC 14443-4, data items of three types formats including an I-block (Information block), R-block (Receive ready block), and S-block (Supervisory block) are transmitted/received as block transmission. The I-block, R-block, and S-block each have roles different from each other. The I-block is a format used to transmit information to be used in an application layer. For normal data read and data write, the I-block is used.

The R-block is a format used to transmit a positive acknowledgement or a negative acknowledgement. The R-block has some types such as an R-block (ACK), R-block (NAK), and the like. The R-block (ACK) is used to request a next command. The R-block (NAK) is used to request retransmission of a received command.

The S-block is a format used to exchange control information items between the IC card processing device 1 and IC card 2. For example, the S-block is used as an extension request of the processing time (WTX: WAITING TIME EXTENSION), and command (Deselect) to deactivate an IC card. It should be noted that in the S-block, one of the extension request of the processing time (WTX) and command (Deselect) to deactivate the IC card is designated by the PCB.

As shown in FIG. 3, a frame conforming to a block format stipulated in ISO/IEC 14443 includes fields such as a prologue field, information field (INF: Information), epilogue field (EDC: Error Detection Code), and the like. Each of the I-block, R-block, and S-block conforms to the block format shown in FIG. 3.

The prologue field includes data items such as a Protocol Control Byte (PCB), Card IDentifier (CID), Node Address (NAD), and the like.

The PCB is a protocol control byte. The PCB can transmit information necessary for data transmission control to the equipment (external equipment) of the partner side. For example, the PCB includes information indicating whether the frame is an I-block or an R-block or an S-block.

The CID is a card identifier. The CID is data configured to designate an IC card of the processing object. The IC card 2 has the CID stored in the RAM 23 or in the NVM 24.

The NAD is a node address. The NAD is data configured to construct different logical connections.

The information field (INF) is, for example, a field in which a data main body of a command, application data, state information or the like is stored. The IC card 2 executes various processing operations according to the data stored in the information field. It should be noted that the information field may be omitted. In the R-block, the information field is omitted.

In the epilogue field (EDC: Error Detection Code), for example, a redundancy check code such as a CRC (Cyclic Redundancy Check) or the like is stored in order to detect data abnormality caused by a communication error or the like. The redundancy check code is a value to be calculated on the basis of data items of the prologue field and information field. The equipment on the reception side can detect data abnormality such as a communication error or the like on the basis of data items in the prologue field and information field of the received data and a redundancy check code. For example, the IC card processing device 1 which has received an I-block from the IC card 2 checks the consistency between a redundancy check code stored in the epilogue field (EDC) of the received I-block, and redundancy check code created from the prologue field and information field to thereby check presence/absence of a communication error.

Next, functions realized by the CPU 11 of the card processing device 1 will be described below.

The CPU 11 has a function of creating a detailed redundancy check code of data received from the IC card 2. The detailed redundancy check code is an aggregate of redundancy check codes of divided blocks formed by dividing data into a plurality of blocks. That is, the detailed redundancy check code is a redundancy check code associated with all parts of data.

Figure 4:
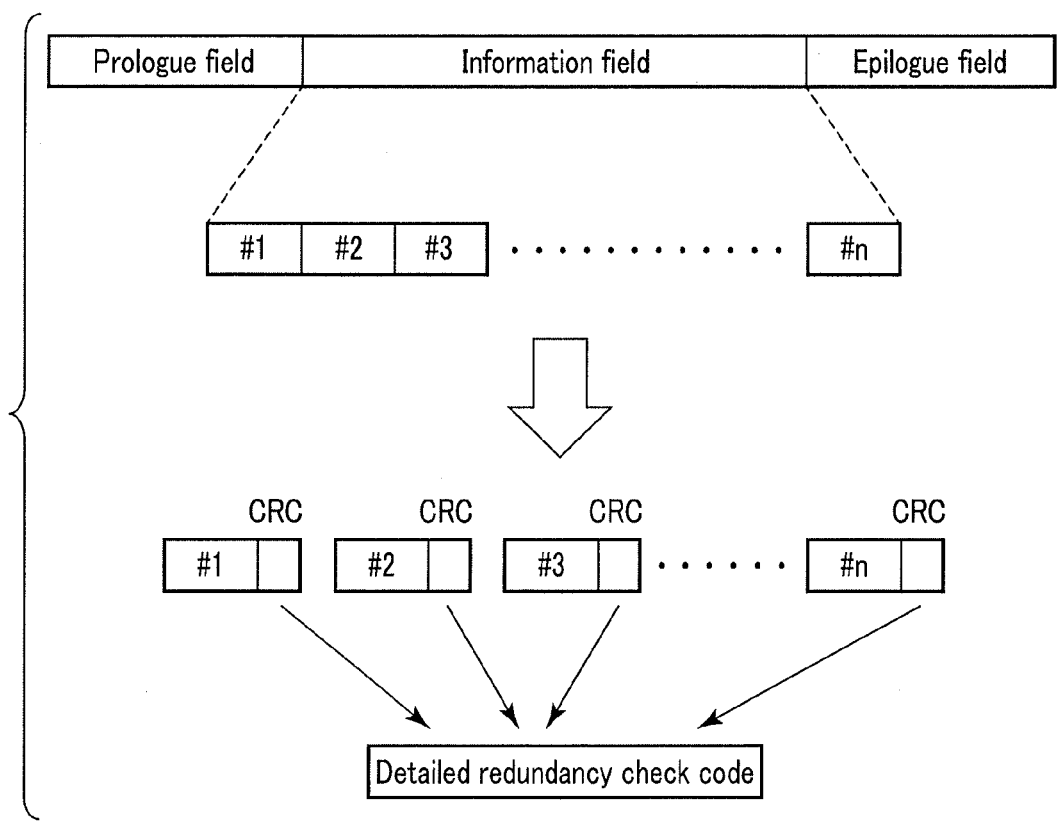
FIG. 4 is a view for explaining an example of an operation of creating a detailed redundancy check code according to the embodiment.

FIG. 4 shows an example of an operation of creating a detailed redundancy check code.

First, the CPU 11 extracts data from the information field of the data format. After extracting the data, the CPU 11 divides the extracted data into divided blocks each having predetermined lengths (fixed lengths). Here, to each of the divided blocks, a unique block number is assigned so that the IC card 2 can recognize the divided blocks. For example, the block numbers are assigned on the basis of the order of the divided blocks.

After dividing the extracted data into the divided blocks each having the fixed lengths, the CPU 11 subjects the last divided block to padding processing. The padding processing is processing, when a length of a divided block is shorter than the fixed length, of adding predetermined data to the divided block in such a manner that the length of the divided block becomes the fixed length.

After carrying out the padding processing, the CPU 11 creates a redundancy check code for each of the divided blocks. After creating a redundancy check code for each of the divided blocks, the CPU 11 serially connects the redundancy check codes to each other in the order of the divided blocks to thereby create a detailed redundancy check code.

Further, the CPU 11 has a function of comparing a detailed redundancy check code received from the IC card 2 through the card reader/writer 15, and the created detailed redundancy check code with each other to thereby identify a broken divided block (erroneous divided block).

That is, the CPU 11 compares a redundancy check code corresponding to each divided block, and included in the detailed redundancy check code received from the IC card 2, and redundancy check code corresponding to each divided block, and included in the created detailed redundancy check code with each other. The CPU 11 determines that a divided block in which both the redundancy check codes are identical to each other is not broken. Further, the CPU 11 determines that a divided block in which both the redundancy check codes differ from each other is broken.

Further, the CPU 11 has a function of acquiring a divided block corresponding to the erroneous divided block from the IC card 2 through the card reader/writer 15. For example, the CPU 11 transmits a request command to request a divided block corresponding to the erroneous divided block to the IC card 2, and receives the relevant divided block from the IC card 2. The request command stores therein a block number indicating the divided block in order to identify the divided block. Here, the request command of the divided block is formed in the format of an X-block.

FIG. 5 is a view showing a configuration example of a format of the X-block.

As shown in FIG. 5, the X-block is constituted of a prologue field, information field, epilogue field, and the like as in the cases of other blocks. Each of the prologue field, information field, and epilogue field has a function identical to each of the fields of the other blocks.

FIG. 6 shows a configuration example of a PCB of the X-block.

As shown in FIG. 6, the PCB of the X-block is data of one byte, and includes the first bit b1 to the eighth bit b8.

The first bit b1 is a block number. The block number indicates a communication phase.

The second bit b2 is a specified value "1".

The third bit b3 indicates whether or not an NAD accompanies. When the third bit b3 is "1", the third bit b3 indicates that an NAD accompanies. Further, when the third bit b3 is "0", the third bit b3 indicates that an NAD does not accompany.

The fourth bit b4 indicates whether or not a CID accompanies. When the fourth bit b4 is "1", the fourth bit b4 indicates that a CID accompanies. Further, when the fourth bit b4 is "0", the fourth bit b4 indicates that a CID does not accompany.

Each of the fifth bit b5 and sixth bit b6 is the specified value "1".

Each of the seventh bit b7 and eighth bit b8 indicates a format of the frame. Here, the seventh bit b7 and eighth bit b8 store "1", and "0", respectively. In this case, the seventh bit b7 and eighth bit b8 indicate that the format of the frame is the X-block.

Further, as shown in FIG. 5, the format of the X-block stores therein a length of the information field (INF) and block number.

The "length" indicates the data length of the subsequent block of the block number. Here, the data length indicates the number of bytes. Here, the "length" is data of one byte. Here, the "length" stores therein "00000011". That is, the "length" indicates that data of three bytes subsequently follows.

The "block number" indicates a divided block to be acquired from the IC card 2. Here, the information field stores therein three "block numbers". The block numbers are "00000001", "00000010", and "00000111", respectively. Accordingly, the X-block shown in FIG. 5 is a request command to request the divided blocks of the block numbers "1", "2", and "7".

Further, the CPU 11 has a function of replacing an erroneous divided block with a divided block newly read from the IC card 2. That is, the CPU 11 replaces an erroneous divided block in the data read from the IC card 2 for the first time with a newly acquired divided block.

Next, the functions realized by the CPU 21 of the IC card 2 will be described below.

The CPU 21 has a function of counting the number of times a retransmission request is received from the IC card processing device 1. That is, the CPU 21 increments the retransmission request counter stored in the storage area 23a by one each time a data retransmission request is received through the communication section 25.

Further, the CPU 21 has a function of creating a detailed redundancy check code of data stored in the NVM 24 or the like when the retransmission request counter has reached a predetermined threshold. The detailed redundancy check code and the creation method thereof are identical to those described previously, and hence descriptions of them are omitted.

Further, the CPU 21 has a function of transmitting the created detailed redundancy check code to the IC card processing device 1.

Further, the CPU 21 has a function of transmitting a divided block indicated by a block number stored in the request command to the IC card processing device 1 according to a request command (X-block) to request the divided block. That is, when creating a detailed redundancy check code, the CPU 21 divides data into divided blocks, and assigns block numbers identical to the IC card processing device 1 to the respective divided blocks. The CPU 21 transmits a divided block of a block number stored in the request command to the IC card processing device 1.

Next, data communication between the IC card processing device 1 and IC card 2 will be described below.

FIG. 7 is a sequence diagram for explaining data communication between the IC card processing device 1 and IC card 2.

Here, it is assumed that the IC card processing device 1 acquires predetermined data stored in the NVM 24 from the IC card 2.

Further, it is also assumed that the IC card processing device 1 has already established communication with the IC card 2. For example, the IC card processing device 1 transmits a polling signal through the card reader/writer 15, and the IC card 2 receives the polling signal. The IC card 2 transmits a response to the polling signal to the IC card processing device 1. The IC card processing device 1 transmits information necessary for communication to the IC card 2. The IC card 2 receives the information necessary for communication, and sets the received information to itself.

First, the CPU 11 of the IC card processing device 1 transmits a request command (I-block) (first command) to request data (objective data) to the IC card 2 through the card reader/writer 15.

The CPU 21 of the IC card 2 receives the request command through the communication section 25. Upon receipt of the request command, the CPU 21 reads data from the NVM 24, and creates a response (first response) in which the read data is stored in the data section. Upon creation of the response, the CPU 21 transmits the response to the IC card processing device 1 through the communication section 25.

The CPU 11 of the IC card processing device 1 receives the response including the objective data through the card reader/writer 15. Upon receipt of the response, the CPU 11 checks the EDC of the response. That is, the CPU 11 determines whether or not the response has appropriately been received by using a redundancy check code stored in the epilogue of the response. Here, it is assumed that the CPU 11 determines that the response has not appropriately been received by the checking of the EDC.

Upon determination that the response has not appropriately been received, the CPU 11 transmits a retransmission request command (R-block) (second command) which is a retransmission request of the objective data to the IC card 2 through the card reader/writer 15.

For example, the retransmission request command is an R-block indicating an NAK (Negative AcKnowledgement).

When the retransmission request command has been transmitted, the CPU 21 creates a detailed redundancy check code of the received data.

The CPU 21 of the IC card 2 receives the retransmission request command which is a retransmission request of the objective data through the communication section 25. Upon receipt of the retransmission request command, the CPU 21 increments the retransmission request counter stored in the storage area 23a by one. After incrementing the retransmission request counter by one, the CPU 21 determines whether or not the retransmission request counter has reached the predetermined threshold. Here, it is assumed that the CPU 21 determines that the retransmission request counter has reached the predetermined threshold.

Upon determination that the retransmission request counter has reached the predetermined threshold, the CPU 21 creates a detailed redundancy check code of the retransmission-requested objective data. Upon creation of the detailed redundancy check code, the CPU 21 transmits a response (second response) including the created detailed redundancy check code to the IC card processing device 1 through the communication section 25. Here, the response does not include at least part of the objective data.

The CPU 11 of the IC card processing device 1 receives the detailed redundancy check code through the card reader/writer 15.

Upon receipt of the detailed redundancy check code, the CPU 11 identifies an erroneous divided block on the basis of the received detailed redundancy check code, and a detailed redundancy check code created by the CPU 11 itself.

Upon identification of the erroneous divided block, the CPU 11 creates a request command to request the erroneous divided block. That is, the CPU 11 creates a request command (X-block) (third command) including a block number indicating the erroneous divided block. Upon creation of the request command to request the erroneous divided block, the CPU 11 transmits the request command to the IC card 2 through the card reader/writer 15.

The CPU 21 of the IC card 2 receives the request command through the communication section 25. Upon receipt of the request command, the CPU 21 creates a response (third response) including a divided block indicated by the block number stored in the request command. Upon creation of the response, the CPU 21 transmits the created response to the IC card processing device 1 through the communication section 25.

The CPU 11 of the IC card processing device 1 receives the response through the card reader/writer 15. Upon receipt of the response, the CPU 11 replaces the erroneous divided block with the divided block stored in the response. Upon replacement of the erroneous divided block with the divided block stored in the response, the CPU 11 integrates the divided blocks with each other to thereby create complete data. Upon creation of the complete data, the CPU 11 terminates the operation.

Next, an operation example of the IC card 2 will be described below.

Figure 8:
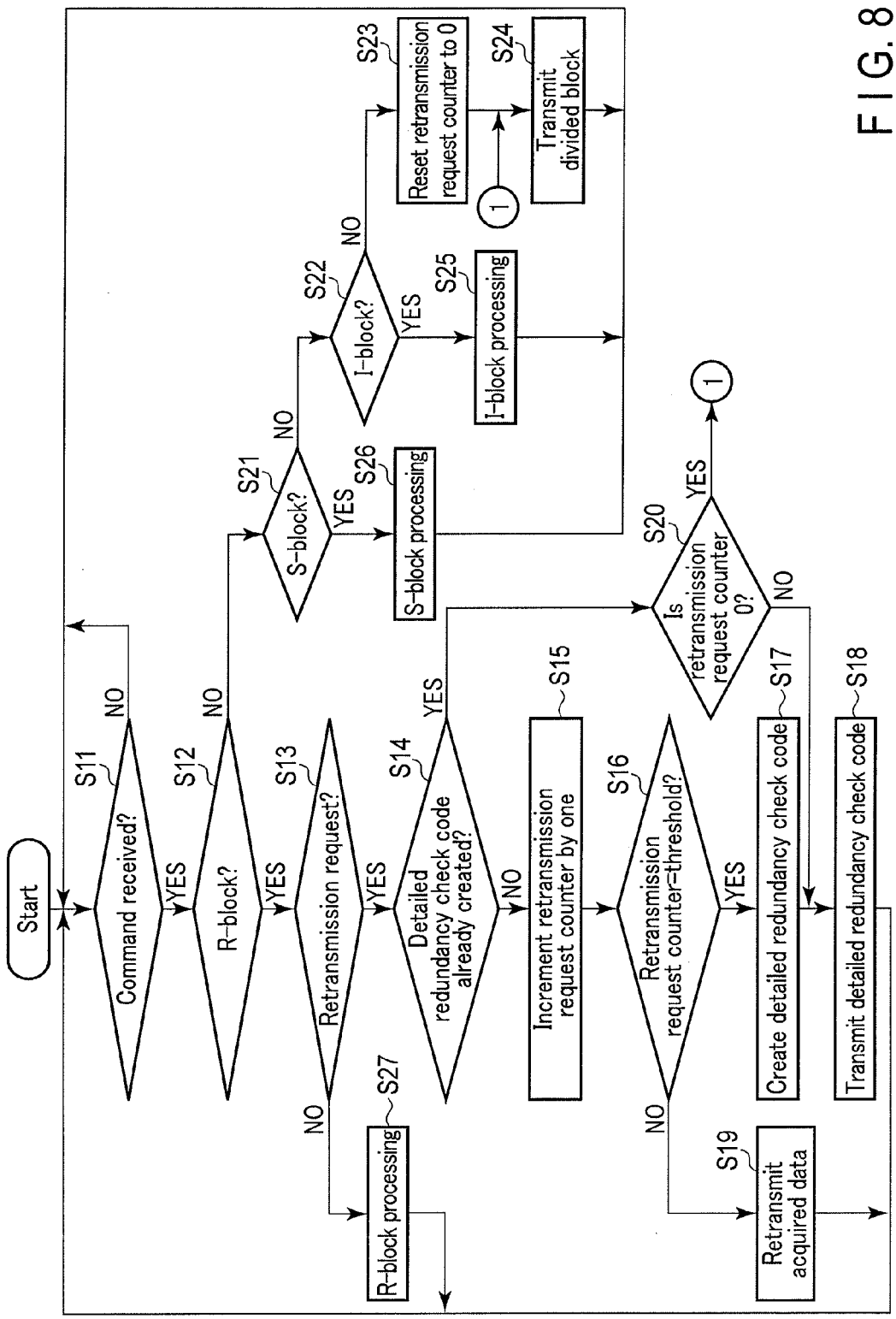
FIG. 8 is a flowchart for explaining an operation example of the IC card according to the embodiment.

FIG. 8 is a flowchart for explaining an operation example of the IC card 2.

Here, it is assumed that the IC card processing device 1 and the IC card 2 are in a state where they can carry out communication with each other.

First, the CPU 21 of the IC card 2 determines whether or not a command has been received through the communication section 25 (step S11).

Upon determination that a command has been received (YES in step S11), the CPU 21 determines whether or not the received command is an R-block (step S12). For example, the CPU 21 determines whether or not b8-7 of the PCB of the received command is "10". Here, "10" indicates that the received command is an R-block.

Upon determination that the received command is an R-block (YES in step S12), the CPU 21 determines whether or not the received command is a retransmission request (step S13).

Upon determination that the received command is a retransmission request (YES in step S13), the CPU 21 determines whether or not a detailed redundancy check code has already been created (step S14). When a detailed redundancy check code has already been created as in the case of steps S17 and S18, the CPU 21 transmits the detailed redundancy check code to the IC card processing device 1. Accordingly, when a detailed redundancy check code has already been created, the received command is not a retransmission request of the objective data (that is, a retransmission request of a detailed redundancy check code or a divided block). On the other hand, when a detailed redundancy check code has not been created yet, the received command is a retransmission request of the objective data.

Upon determination that a detailed redundancy check code has not been created yet (that is, upon determination that the received command is a retransmission request of the objective data) (NO in step S14), the CPU 21 increments the retransmission request counter stored in the storage area 23a by one (step S15).

After incrementing the retransmission request counter, the CPU 21 determines whether or not the retransmission request counter has reached the threshold (step S16).

Upon determination that the retransmission request counter has reached the threshold (YES in step S16), the CPU 21 creates a detailed redundancy check code of the objective data (step S17). Upon creation of the detailed redundancy check code, the CPU 21 transmits the created detailed redundancy check code to the IC card processing device 1 through the communication section 25 (step S18).

Upon determination that the retransmission request counter has not reached the threshold yet (NO in step S16), the CPU 21 transmits the objective data to the IC card processing device 1 through the communication section 25 (step S19).

Upon determination that a detailed redundancy check code has already been created (YES in step S14), the CPU 21 determines whether or not the value of the retransmission request counter is 0 (step S20). Upon receipt of a request command (X-block) of a divided block once in step S23, the CPU 21 resets the retransmission request counter to 0. Accordingly, when the value of the retransmission request counter is 0, the received command is a retransmission request command (X-block) of a divided block. On the other hand, when the value of the retransmission request counter is not 0, the received command is a retransmission request command of a detailed redundancy check code.

Upon determination that the value of the retransmission request counter is 0 (YES in step S20), the CPU 21 advances to step S18. Upon determination that the value of the retransmission request counter is not 0 (NO in step S20), the CPU 21 advances to step S24.

Upon determination that the received command is not an R-block (NO in step S12), the CPU 21 determines whether or not the received command is an S-block (step S21). For example, the CPU 21 determines whether or not b8-7 of the PCB of the received command is "11". Here, "11" indicates that the received command is an S-block.

Upon determination that the received command is not an S-block (NO in step S21), the CPU 21 determines whether or not the received command is an I-block (step S22). For example, the CPU 21 determines whether or not b8-7 of the PCB of the received command is "00". Here, "00" indicates that the received command is an I-block.

Upon determination that the received command is not an I-block (that is, upon determination that the received command is an X-block) (NO in step S22), the CPU 21 resets the retransmission request counter stored in the storage area 23*a* to 0 (step S23).

After resetting the retransmission request counter to 0, the CPU 21 transmits a divided block indicated by a block number stored in the received command (X-block) to the IC card processing device 1 through the communication section 25 (step S24). It should be noted that upon determination that the value of the retransmission request counter is not 0 (NO in step S20), the CPU 21 transmits the divided block which has been transmitted immediately before to the IC card processing device 1 again through the communication section 25.

Upon determination that the received command is an I-block (YES in step S22), the CPU 21 carries out processing corresponding to the received I-block (step S25).

Upon determination that the received command is an S-block (YES in step S21), the CPU 21 carries out processing corresponding to the received S-block (step S26).

Upon determination that the received command is not a retransmission request (NO in step S13), the CPU 21 carries out processing corresponding to the received R-block (step S27).

When it is determined that a command has not been received (NO in step S11), when the detailed redundancy check code has been transmitted to the IC card processing device 1 (step S18), when the objective data has been transmitted to the IC card processing device 1 (step S19), when the divided block has been transmitted to the IC card processing device 1 (step S24), when processing corresponding to the received I-block has been carried out (step S25), when processing corresponding to the received S-block has been carried out (step S26), or when processing corresponding to the received R-block has been carried out (step S27), the CPU 21 returns to step S11.

Next, an operation example of the IC card processing device 1 will be described below.

Figure 9:
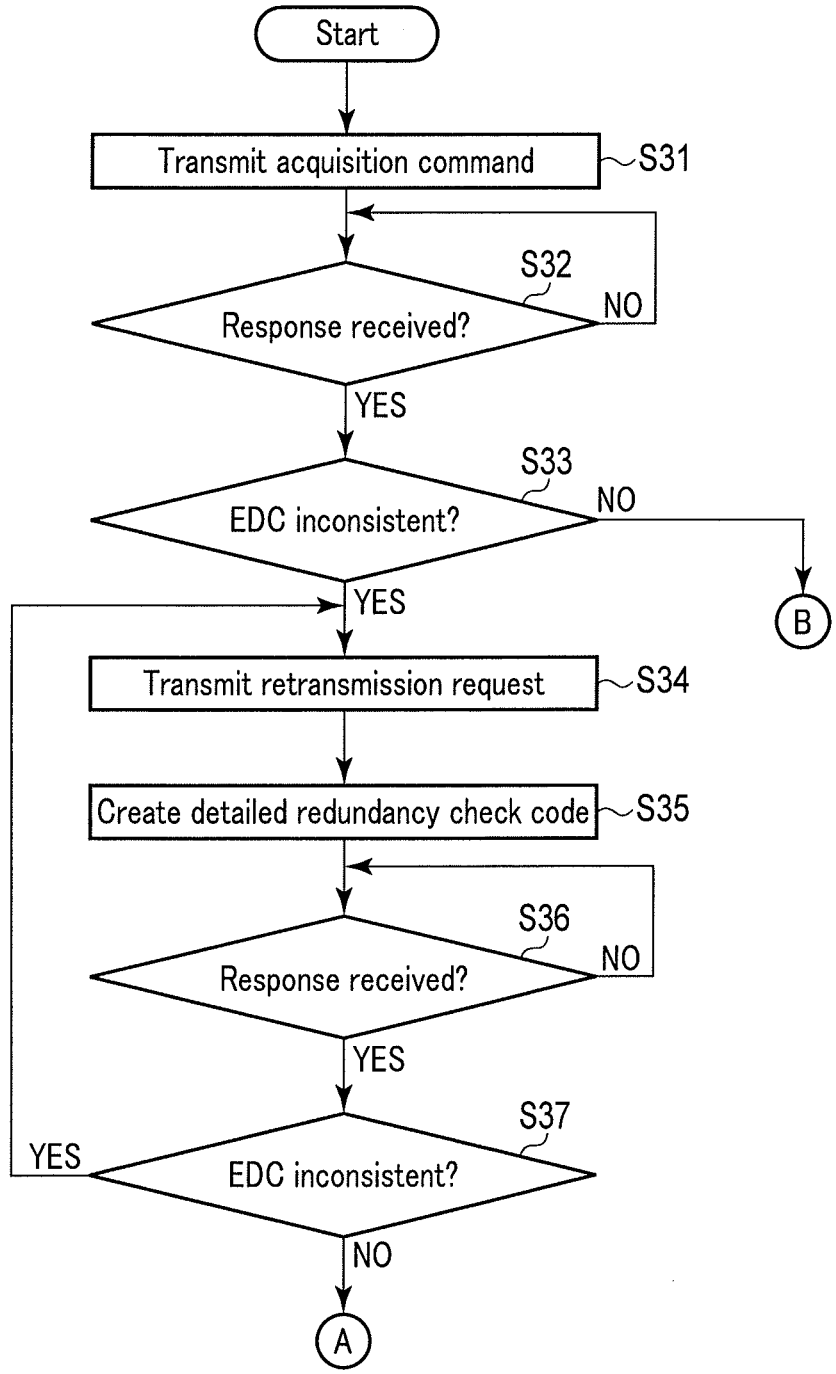
FIG. 9 is a flowchart for explaining an operation example of the IC card processing device according to the embodiment.
Figure 10:
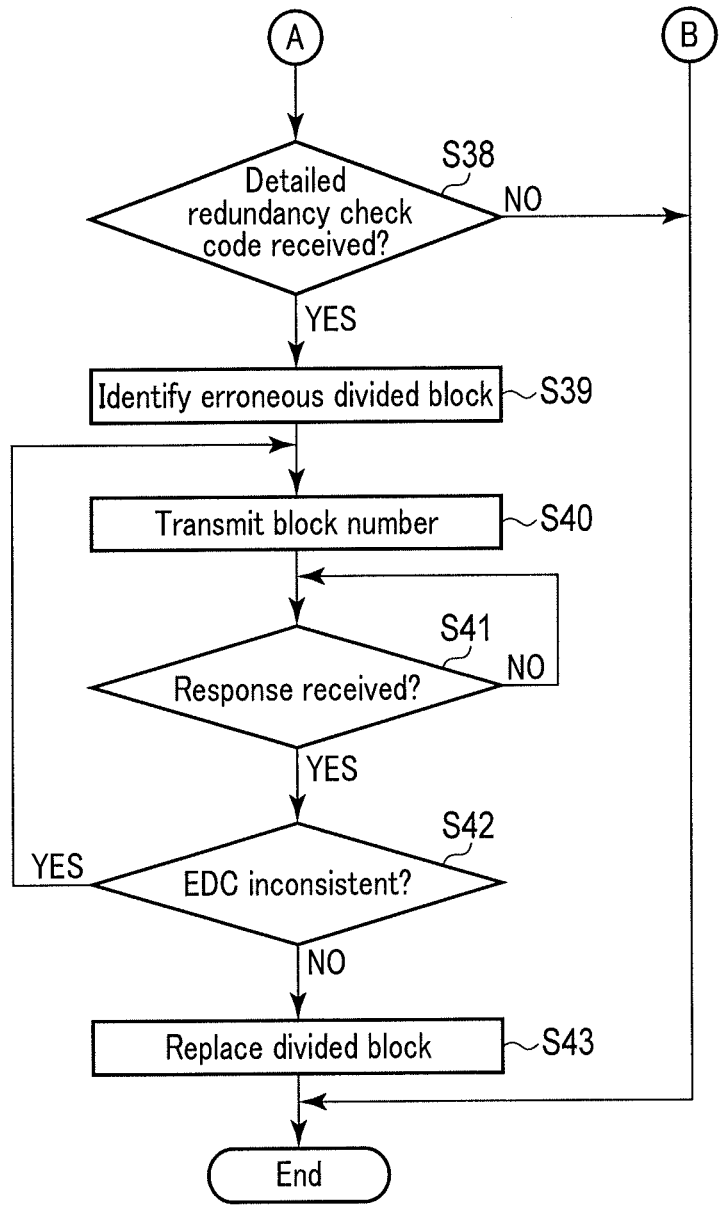
FIG. 10 is a flowchart for explaining an operation example of the IC card processing device according to the embodiment.

FIG. 9 and FIG. 10 are flowcharts for explaining the operation example of the IC card processing device 1.

Here, it is assumed that the IC card processing device 1 and the IC card 2 are in a state where they can carry out communication with each other.

First, the CPU 11 of the IC card processing device 1 transmits a request command to request objective data to the IC card 2 through the card reader/writer 15 (step S31).

Upon transmission of the request command to the IC card 2, the CPU 11 determines whether or not a response to the request command has been received through the card reader/writer 15 (step S32).

Upon determination that a response has not been received (NO in step S32), the CPU 11 returns to step S32.

Upon determination that a response has been received (YES in step S32), the CPU 11 determines whether or not the redundancy check code (EDC) of the received response is inconsistent (step S33). That is the CPU 11 checks the response by using the redundancy check code stored in the epilogue field.

Upon determination that the EDC is inconsistent (YES in step S33), the CPU 11 transmits a retransmission request to the IC card 2 through the card reader/writer 15 (step S34).

When the retransmission request has been transmitted, the CPU 21 creates a detailed redundancy check code of the data (broken objective data) stored in the data section of the response received in step S32 (step S35).

When the detailed redundancy check code has been created, the CPU 11 determines whether or not a response to the retransmission request has been received through the card reader/writer 15 (step S36). Upon determination that a response has not been received (NO in step S36), the CPU 11 returns to step S36.

Upon determination that a response has been received, the CPU 11 determines whether or not the EDC of the received response is inconsistent (step S37). Upon determination that the EDC is inconsistent (YES in step 37), the CPU 11 returns to step S34.

Upon determination that the EDC is not inconsistent (NO in step S37), the CPU 11 determines whether or not the received response stores therein a detailed redundancy check code (step S38).

Upon determination that the response stores therein a detailed redundancy check code (YES in step S38), the CPU 11 compares the detailed redundancy check code received in step S36, and detailed redundancy check code created in step S35 with each other to thereby identify an erroneous divided block (step S39).

Upon identification of an erroneous divided block, the CPU 11 transmits a request command including a block number indicating the erroneous divided block to the IC card 2 through the card reader/writer 15 (step S40).

Upon transmission of the request command including the block number to the IC card 2, the CPU 11 determines whether or not a response to the request command has been received through the card reader/writer 15 (step S41). Upon determination that a response has not been received, the CPU 11 returns to step S41.

Upon determination that a response has been received, the CPU 11 determines whether or not the EDC of the received response is inconsistent (step S42). Upon determination that the EDC is inconsistent (YES in step S42), the CPU 11 returns to step S40.

Upon determination that the EDC is not inconsistent (NO in step S42), the CPU 11 replaces the erroneous divided block identified in step S39 with the divided block received in step S41 (step S43).

When the EDC is not inconsistent (NO in step S33), when the response does not store therein a detailed redundancy check code (NO in step S38), or when the erroneous divided block has been replaced (step S43), the CPU 11 terminates the operation.

It should be noted that after receiving the detailed redundancy check code from the IC card 2, the CPU 11 may create a detailed redundancy check code of the data which has been received immediately before.

The IC card configured as described above can transmit a detailed redundancy check code to the IC card processing device when the IC card processing device cannot correctly receive data from the IC card. As a result, it is possible for the IC card processing device to identify which block of the data received immediately before is broken, and acquire a new block corresponding to the broken block from the IC card. Accordingly, in the IC card processing system, it is possible to efficiently transmit data having a large data length from the IC card to the IC card processing device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A portable electronic device configured to execute a command from an external device comprising:
    an interface configured to communicate with the external device; and
    a controller configured to:
    receive a first command to request data through the interface;
    transmit a first response including the data through the interface;
    receive a second command which is a retransmission request of the data through the interface;
    create a detailed redundancy check code including a redundancy check code of each of divided blocks formed by dividing the data into blocks each possessing predetermined lengths when receiving the second command;
    transmit a second response including the detailed redundancy check code through the interface;
    receive a third command to request an erroneous divided block of the data through the interface; and
    transmit a third response including a divided block corresponding to the erroneous divided block through the interface.

2. The portable electronic device according to claim 1, wherein
    the second response does not include at least part of the data.

3. The portable electronic device according to claim 2, further comprising:
    a storage section storing therein a counter configured to count the number of times the controller receives the second command,
    wherein the controller creates the detailed redundancy check code when the counter stored in the storage section has reached a predetermined threshold.

4. The portable electronic device according to claim 2, wherein
    the controller divides the data into a plurality of divided blocks each possessing predetermined lengths, creates a redundancy check code of each of the plurality of divided blocks, and connects the plurality of created redundancy check codes to each other in the order of the divided blocks to thereby create the detailed redundancy check code.

5. The portable electronic device according to claim 1, further comprising:
    a storage section storing therein a counter configured to count the number of times the controller receives the second command,
    wherein the controller creates the detailed redundancy check code when the counter stored in the storage section has reached a predetermined threshold.

6. The portable electronic device according to claim 1, wherein
    the controller divides the data into a plurality of divided blocks each possessing predetermined lengths, creates a redundancy check code of each of the plurality of divided blocks, and connects the plurality of created redundancy check codes to each other in the order of the divided blocks to thereby create the detailed redundancy check code.

7. The portable electronic device according to claim 1, wherein
    the third command includes a block number identifying the erroneous divided block.

8. The portable electronic device according to claim 1, wherein
    the second command is an R-block indicating an NAK.

9. The portable electronic device according to claim 1, further comprising:
    a module including the interface and the controller; and
    a main body in which the module is encased.

10. The portable electronic device according to claim 1, wherein
    the device is an IC card.

* * * * *